United States Patent
Rahimo et al.

(10) Patent No.: US 9,153,676 B2
(45) Date of Patent: Oct. 6, 2015

(54) INSULATED GATE BIPOLAR TRANSISTOR

(71) Applicant: ABB Technology AG, Zürich (CH)

(72) Inventors: Munaf Rahimo, Uezwil (CH); Maxi Andenna, Dättwil (CH); Chiara Corvasce, Bergdietikon (CH); Arnost Kopta, Zürich (CH)

(73) Assignee: ABB TECHNOLOGY AG, Zurich (CH)

( * ) Notice: Subject to any disclaimer, the term of this patent is extended or adjusted under 35 U.S.C. 154(b) by 96 days.

(21) Appl. No.: 14/154,736

(22) Filed: Jan. 14, 2014

(65) Prior Publication Data

US 2014/0124830 A1 May 8, 2014

Related U.S. Application Data

(63) Continuation of application No. PCT/EP2012/063305, filed on Jul. 6, 2012.

(30) Foreign Application Priority Data

Jul. 14, 2011 (EP) .................................. 11173910

(51) Int. Cl.
*H01L 29/732* (2006.01)
*H01L 29/739* (2006.01)
(Continued)

(52) U.S. Cl.
CPC ........ *H01L 29/7395* (2013.01); *H01L 29/0696* (2013.01); *H01L 29/1095* (2013.01);
(Continued)

(58) Field of Classification Search
CPC ............ H01L 29/7397; H01L 29/1095; H01L 29/66348; H01L 29/66333
USPC ........................... 257/592; 438/138, 350, 370
See application file for complete search history.

(56) References Cited

U.S. PATENT DOCUMENTS 5,679,966 A 10/1997 Baliga et al.
6,194,884 B1 2/2001 Kesler et al.
(Continued)

FOREIGN PATENT DOCUMENTS

| EP | 1089343 A2 | 4/2001 |
|---|---|---|
| EP | 1835542 A2 | 9/2007 |
| JP | 2011-040586 A | 2/2011 |

OTHER PUBLICATIONS

International Search Report (PCT/ISA/210) mailed on Dec. 10, 2012, by the European Patent Office as the International Searching Authority for International Application No. PCT/EP2012/063305.

(Continued)

*Primary Examiner* — George Fourson, III
(74) *Attorney, Agent, or Firm* — Buchanan Ingersoll & Rooney PC

(57) ABSTRACT

An IGBT has layers between emitter and collector sides, including a drift layer, a base layer electrically contacting an emitter electrode and completely separated from the drift layer, first and second source regions arranged on the base layer towards the emitter side and electrically contacting the emitter electrode, and first and second trench gate electrodes. The first trench gate electrodes are separated from the base layer, the first source region and the drift layer by a first insulating layer. A channel is formable between the emitter electrode, the first source region, the base layer and the drift layer. A second insulating layer is arranged on top of the first trench gate electrodes. An enhancement layer separates the base layer from the drift layer. The second trench gate electrode is separated from the base layer, the enhancement layer and the drift layer by a third insulating layer.

18 Claims, 7 Drawing Sheets

(51) Int. Cl.
  *H01L 29/06* (2006.01)
  *H01L 29/10* (2006.01)
  *H01L 29/66* (2006.01)
  *H01L 29/40* (2006.01)
  *H01L 29/08* (2006.01)

(52) U.S. Cl.
  CPC ........ *H01L29/407* (2013.01); *H01L 29/66325* (2013.01); *H01L 29/66348* (2013.01); *H01L 29/7397* (2013.01); *H01L 29/0847* (2013.01)

(56) References Cited

U.S. PATENT DOCUMENTS

| | | | |
|---|---|---|---|
| 6,303,410 B1* | 10/2001 | Baliga | 438/138 |
| 6,452,231 B1 | 9/2002 | Nakagawa et al. | |
| 6,566,691 B1 | 5/2003 | Inoue et al. | |
| 2001/0048132 A1* | 12/2001 | Ito et al. | 257/330 |
| 2002/0179976 A1* | 12/2002 | Takahashi | 257/370 |
| 2003/0141542 A1* | 7/2003 | Ishimura et al. | 257/330 |
| 2004/0173845 A1* | 9/2004 | Aoki | 257/329 |
| 2005/0045960 A1* | 3/2005 | Takahashi | 257/368 |
| 2005/0263853 A1* | 12/2005 | Tomomatsu et al. | 257/565 |
| 2006/0001084 A1* | 1/2006 | Kelly et al. | 257/329 |
| 2007/0063269 A1 | 3/2007 | Ng et al. | |
| 2007/0069287 A1 | 3/2007 | Takahashi | |
| 2009/0309156 A1* | 12/2009 | Darwish et al. | 257/332 |
| 2010/0059028 A1 | 3/2010 | Ueno | |
| 2010/0327313 A1* | 12/2010 | Nakamura | 257/133 |
| 2011/0298042 A1* | 12/2011 | Tu | 257/330 |
| 2012/0061748 A1* | 3/2012 | Kobayashi | 257/330 |
| 2012/0098055 A1* | 4/2012 | Darwish et al. | 257/330 |
| 2013/0026537 A1 | 1/2013 | Rahimo et al. | |
| 2013/0341643 A1* | 12/2013 | Kudou et al. | 257/77 |
| 2014/0008664 A1* | 1/2014 | Kudou | 257/77 |
| 2014/0124829 A1 | 5/2014 | Andenna et al. | |
| 2014/0124831 A1 | 5/2014 | Rahimo et al. | |
| 2014/0339600 A1 | 11/2014 | Yoshikawa | |
| 2015/0014742 A1 | 1/2015 | Lu | |

OTHER PUBLICATIONS

Written Opinion (PCT/ISA/237) mailed on Dec. 10, 2012, by the European Patent Office as the International Searching Authority for International Application No. PCT/EP2012/063305.
European Search Report mailed on Oct. 5, 2011 for European Application No. 11173910.
V.K. Khanna, IGBT Theory and Design, Dec. 31, 2003, IEEE Press, USA, pp. 411-427.
B. Jayant Baliga, Power Semiconductor Devices, Dec. 31, 1995, PWS Publishing Company, USA, pp. 496-498.
International Search Report (Form PCT/ISA/210) issued on Dec. 5, 2012, in the International Application No. PCT/EP2012/063313. (3 pages).
Notification of Transmittal of the International Search Report (Form PCT/ISA/220) and the Written Opinion of the International Searching Authority (Form PCT/ISA/237) issued on Dec. 5, 2012, in the International Application No. PCT/EP2012/063313. (8 pages).
International Preliminary Report on Patentability (Form PCT/IB/373) and the Written Opinion of the International Searching Authority (Form PCT/ISA/237) issued on Jan. 14, 2014, in the International Application No. PCT/EP2012/063313. (7 pages).
International Preliminary Report on Patentability (Form PCT/IB/373) and the Written Opinion of the International Searching Authority (Form PCT/ISA/237) issued on Jan. 14, 2014, in the corresponding International Application No. PCT/EP2012/063305. (8 pages).

* cited by examiner

US 9,153,676 B2

INSULATED GATE BIPOLAR TRANSISTOR

RELATED APPLICATIONS

This application claims priority as a continuation application under 35 U.S.C. §120 to PCT/EP2012/063305, which was filed as an International Application on Jul. 6, 2012 designating the U.S., and which claims priority to European Application 11173910.8 filed in Europe on Jul. 14, 2011. The entire contents of these applications are hereby incorporated by reference in their entireties.

FIELD

The present disclosure relates to the field of power semiconductor devices. More particularly, the present disclosure relates to an Insulated Gate Bipolar Transistor (IGBT), and to a method of manufacturing an IGBT.

BACKGROUND INFORMATION

FIG. 1 shows a known IGBT 120 with planar gate electrodes. The IGBT 120 is a device with a four-layer structure, which layers are arranged between an emitter electrode 2 on an emitter side 11 and a collector electrode 25 on a collector side 15, which is arranged opposite of the emitter side 11. An (n−) doped drift layer 8 is arranged between the emitter side 11 and the collector side 15. A p doped base layer 5 is arranged between the drift layer 8 and the emitter electrode 2, which base layer 5 is in direct electrical contact with the emitter electrode 2. An n-doped source region 7 is arranged on the emitter side 11 embedded into the planar base layer 5 and contacts the emitter electrode 2.

A planar gate electrode 31 is arranged on top of the emitter side 11. The planar gate electrode 31 is electrically insulated from the base layer 5, the first source region 7 and the drift layer 8 by a first insulating layer 34. There is a third insulating layer 38 arranged between the planar gate electrode 31 and the emitter electrode 2. On the collector side, a collector layer 9 is arranged between the drift layer 8 and the collector electrode 25.

Such a planar MOS cell design exhibits a number of disadvantages when applied to BiMOS type switch concepts. The device has high on-state losses due to a plurality of effects. The planar design offers a lateral MOS channel which suffers from carrier spreading (also called JFET effect) near the cell. Therefore, the planar cells show low carrier enhancement. Furthermore, due to the lateral channel design, the planar design also suffers from the hole drain effect (PNP effect) due to the lateral electron spreading out of the MOS channel. The region between the cells offers strong charge enhancement for the PiN diode part. This PiN effect, however, can only show a positive impact in high voltage devices with low cell packing densities (a low number of cells within an area). In order to achieve reduced channel resistance, the planar devices are made with less cell packing density, and this can only be compensated with narrow pitches (distance between two cells), thereby reducing the PiN effect.

The high losses have been reduced by the introduction of n doped enhancement layers, which surround the planar base layer.

Concerning the blocking capability, the planar design provides good blocking capability due to low peak fields in the cells and between the cells.

The planar design can have a large MOS accumulation region below the gate electrode and large associated capacitance. Nevertheless, the device shows good controllability due to the application of a field oxide type layer between the cells for miller capacitance reduction. Therefore, good controllability and low switching losses can be achieved for planar design.

Furthermore, the cell densities in planar designs can be easily adjusted for the required short circuit currents.

As a result of taking all the above mentioned effects into account, known planar cells apply very narrow cells and wide pitches with Field Oxide layers.

Alternatively to planar designs, known IGBTs 130 having trench MOS cell designs as shown in FIG. 2 have been introduced, in which a trench gate electrode 3 is electrically insulated from a base layer 5, a first source region 7 and the drift layer 8 by a first insulating layer 34. The trench gate electrode 3 is arranged in the same plane and lateral to the base layer 5 and extends deeper into the drift layer 8 than the base layer 5.

With such trench gate electrode designs, the on-state losses are lower, because the trench design offers a vertical MOS channel, which provides enhanced injection of electrons in the vertical direction and suffers from no drawbacks from charge spreading (so called JFET effect) near the cell. Therefore the trench cells show much improved carrier enhancement for lower losses. Due to the vertical channel design, the trench also offers less hole drain effect (PNP effect) due to the improved electron spreading out of the MOS channel. At the bottom of the trench there is an accumulation layer, which offers strong charge enhancement for the PIN diode part. Hence, wide and/or deep trenches show optimum performance. The trench design offers large cell packing density for reduced channel resistance. The trench design, however, suffers from lower blocking capability near the bottom corners of the trenches due to high peak electric fields. The trench design has a large MOS accumulation region and associated capacitance with difficulty to apply field oxide type layers in the trench for miller capacitance reduction. Therefore, the device results in poor controllability and high switching losses. Furthermore, the high cell densities in trench designs will result in high short circuit currents.

In order to reduce the above mentioned effects, the trench gate electrodes have been made wide and deep, whereas the cells have to be made narrow, so that losses are reduced and short circuit current can be kept low. However, such trenches are difficult to process and will still suffer from bad controllability.

In another known concept shown in FIG. 3, IGBTs 140 having a pitched-trench gate electrode 300 design have been applied, in which a MOS area is inserted between the cells. The two trench gate electrodes 3 are connected by a layer made of the same material as the trench gate electrodes, thereby forming an area below, in which a part of the base layer is arranged, but no source region or contact of the base layer to the emitter electrode is available in this MOS area. However, such devices result in poor blocking properties and high switching losses due to slow field spreading from the pitched area during switching (FIG. 3).

In another approach shown in FIG. 4, dummy trench cells 110 have been introduced into another known IGBT 150, in which active cells 100 and dummy cells 110 are arranged in an alternating manner. The base layer 5 and first source regions 7 do not have contact with the emitter electrode 2 in the dummy cell 110. However, similar problems to those mentioned for the pitched-trench design apply. For this design, n doped enhancement layers may be introduced between the drift layer 8 and the base layer 5 in order to reduce on-state losses.

In JP 2011-40586, another known IGBT 160 shown in FIG. 5 having trench gate electrodes is described. Between two active trenches 3, shallow pitched trenches 300 with an upper lying planar layer of the same electrically conductive poly silicon material are arranged, which do not have contact with the emitter electrode 2 similar to the known IGBT 140 (shown in FIG. 3). However, as one base layer 5 is applied in the active cells as well as in the pitched gate area below the shallow pitched trenches 300, this base layer 5 has to be rather deep because the pitched gate electrodes 300 are embedded in the base layer 5, whereas the active trenches 3 are deeper than the base layer 5. The manufacturing of such trenches 3, 300 with different depths and the deep p base layer 5 is difficult, because the active trenches 3 and the pitched trenches have to be manufactured separately. Furthermore, the deep p base layer 5 is connected to the active trenches 3, which has a negative impact on the device turn-on behaviour in terms of controllability.

SUMMARY

An exemplary embodiment of the present disclosure provides an insulated gated bipolar transistor (IGBT) having layers between an emitter electrode on an emitter side and a collector electrode on a collector side opposite to the emitter side. The exemplary IGBT includes a lowly doped drift layer of a first conductivity type, and a collector layer of a second conductivity type different than the first conductivity type. The collector layer is arranged between the drift layer and the collector electrode, and electrically contacts the collector electrode. The exemplary IGBT also includes a base layer of the second conductivity type arranged between the drift layer and the emitter electrode. The base layer electrically contacts the emitter electrode and is completely separated from the drift layer. In addition, the exemplary IGBT includes first and second source regions of the first conductivity type arranged on the base layer towards the emitter side and electrically contacting the emitter electrode. The first and second source regions have a higher doping concentration than the drift layer. The exemplary IGBT also includes at least two first trench gate electrodes arranged lateral to the base layer and extending deeper into the drift layer than the base layer. The at least two first trench gate electrodes are separated from the base layer, the first source region and the drift layer by a first insulating layer. A first channel is formable from the emitter electrode, the first source region, the base layer and the drift layer between two of the first trench gate electrodes. The first source region is arranged between two of the first trench gate electrodes. Furthermore, the exemplary IGBT includes a second insulating layer arranged on the emitter side on top of the first trench gate electrodes, and an enhancement layer of the first conductivity type arranged between the base layer and the drift layer. The enhancement layer separates the base layer from the drift layer at least in a plane parallel to the emitter side and has a higher doping concentration than the drift layer. The exemplary IGBT also includes a gate electrode including a second trench gate electrode and an electrically conducting layer, both of which are electrically connected to the emitter electrode. The second trench gate electrode is arranged lateral to the base layer and extends deeper into the drift layer than the base layer. The second trench gate electrode is separated from the base layer, the enhancement layer and the drift layer by a third insulating layer. A second channel is formable from the emitter electrode, the second source region, the base layer and the drift layer between one of the first trench gate electrodes and the second trench gate electrode. The second source region is arranged between one of the first trench gate electrodes and the second trench gate electrode. The electrically conductive layer covers and laterally extends outside the second trench gate electrode at least to a region above the base layer. The electrically conductive layer is separated from the base layer by a fourth electrically insulating layer. The electrically conductive layer contacts the second trench gate electrode. The exemplary IGBT also includes a fifth insulating layer arranged on the emitter side on top of the electrically conductive layer, the fifth insulating layer having a recess such that the electrically conducting layer electrically contacts the emitter electrode.

An exemplary embodiment of the present disclosure provides a method of manufacturing an insulated gated bipolar transistor having layers between an emitter electrode on an emitter side and a collector electrode on a collector side opposite to the emitter side. The exemplary method includes providing a lowly doped wafer of a first conductivity type, where part of the wafer having an unamended doping concentration in the finalized insulated gated bipolar transistor forms a drift layer. The exemplary method also includes creating at least two first trench gate electrodes and at least one second trench gate electrode, and creating, for the first and second trench gate electrodes, first and second trench gate electrode trench recesses in the wafer on the emitter side. In addition, the exemplary method includes applying first and third insulating layers in the trench recesses and filling the trench recesses with electrically conductive material. Furthermore, the exemplary method includes creating a fourth insulating layer to laterally surround the second trench gate electrode on the emitter side, and creating an electrically conductive layer on top of the second trench gate electrode. The electrically conductive layer covers and laterally extends outside the second trench gate electrode. A gate electrode comprises the second trench gate electrode and the electrically conductive layer. The exemplary method also includes creating an enhancement layer by introducing a first dopant of the first conductivity type into the wafer on the emitter side using the electrically conductive layer as a mask and diffusing the first dopant into the wafer. In addition, the exemplary method includes creating a base layer by introducing a second dopant of a second conductivity type, which is different than the first conductivity type, into the wafer on the emitter side using the electrically conductive layer as a mask and diffusing the second dopant into the wafer so that the base layer is completely separated from a remaining lowly doped wafer by the enhancement layer. Moreover, the exemplary method includes creating first and second source regions having a higher doping concentration than the lowly doped wafer by applying a third dopant of the first conductivity type between two of the first trench gate electrodes for the creation of the first source region and between one of the first trench gate electrodes and the second trench gate electrode for the creation of the second source region. In addition, the exemplary method includes covering the electrically conductive layer with a fifth insulation layer besides a recess for a contact of the electrically conductive layer to the emitter electrode and covering the first trench gate electrode with the second insulation layer. The exemplary method also includes creating a collector layer of the second conductivity type on the collector side by introducing a fourth dopant of the second conductivity type into the wafer on the collector side and diffusing the fourth dopant into the wafer. The exemplary method includes creating contact openings of the base layer to the emitter electrode between two of the first trench gate electrodes and between one of the first trench gate electrodes and the second trench gate electrode. Furthermore, the exemplary method includes creating the emitter electrode on the emitter side and creating the collector electrode on the collector side.

BRIEF DESCRIPTION OF THE DRAWINGS

Additional refinements, advantages and features of the present disclosure are described in more detail below with reference to exemplary embodiments illustrated in the drawings, in which.

The reference symbols used in the drawings and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
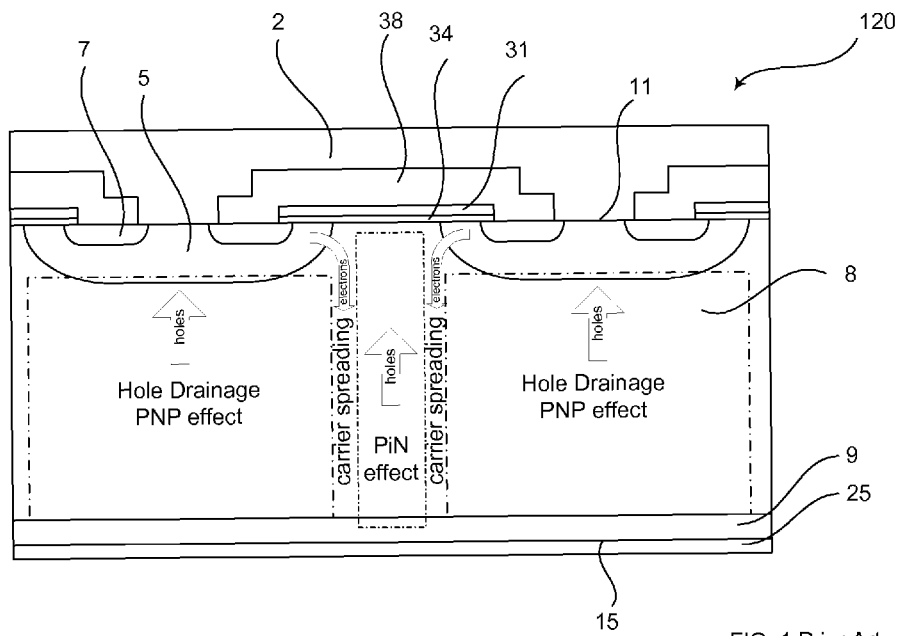
FIG. 1 shows a known IGBT with a planar gate electrode.
Figure 2:
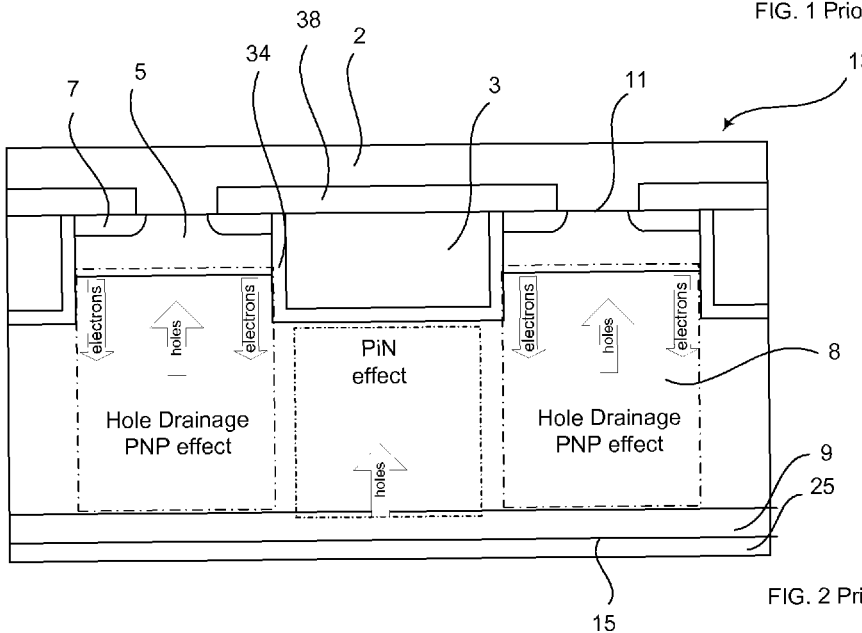
FIG. 2 shows a known IGBT with a trench gate electrode.

Exemplary embodiments of present disclosure provide a power semiconductor device, such as an insulated gate bipolar transistor (IGBT), with reduced on-state and switching losses, improved blocking capability and good controllability, which is easier to manufacture than known devices.

According to an exemplary embodiment, the IGBT of the present disclosure has layers between an emitter electrode on an emitter side and a collector electrode on a collector side opposite to the emitter side. The IGBT includes a drift layer of a first conductivity type, and a collector layer of the second conductivity type different than the first conductivity type, which is arranged between the drift layer and the collector electrode and which electrically contacts the collector electrode. The IGBT also includes a base layer of a second conductivity type, which base layer is arranged between the drift layer and the emitter electrode. The base layer electrically contacts the emitter electrode and is completely separated from the drift layer. In addition, the IGBT includes a first source region of the first conductivity type, which is arranged on the base layer towards the emitter side and electrically contacts the emitter electrode. The first source region has a higher doping concentration than the drift layer. The IGBT also includes at least two first trench gate electrodes, which are arranged lateral to the base layer and extend deeper into the drift layer than the base layer. The at least two first trench gate electrodes are separated from the base layer, the first source region and the drift layer by a first insulating layer. A first channel is formable from the emitter electrode, the first source region, the base layer and the drift layer between two first trench gate electrodes. The first source region is arranged between two first trench gate electrodes. A second insulating layer is arranged on the emitter side on top of the first trench gate electrode. The second insulating layer electrically insulates the first trench gate electrode from the emitter electrode. The IGBT also includes an enhancement layer of the first conductivity type, which is arranged between the base layer and the drift layer. The enhancement layer separates the base layer from the drift layer at least in a plane parallel to the emitter side. A gate electrode includes a second trench gate electrode and an electrically conducting layer, both of which are grounded, i.e. they are electrically connected to the emitter electrode. The second trench gate electrode is arranged lateral to the base layer and extends deeper into the drift layer than the base layer. The second trench gate electrode is separated from any surrounding layer or region (base layer, the enhancement layer and the drift layer) by a third insulating layer. The electrically conductive layer covers and laterally extends outside the second trench gate electrode at least to a region above the base layer. The electrically conductive layer is separated from the base layer by a fourth electrically insulating layer which is arranged parallel to the emitter side and on top of it. The electrically conductive layer contacts the second trench gate electrode. A second channel is formable from the emitter electrode, the second source region, the base layer and the drift layer between a first trench gate electrode and a second trench gate electrode. The second source region is arranged between the first trench gate electrode and the second trench gate electrode. A fifth insulating layer is arranged on the emitter side on top of the second trench gate electrode. The fifth insulating layer has a recess such that the electrically conducting layer electrically contacts the emitter electrode.

The IGBT of the present disclosure has good electrical properties for both the static and dynamic characteristics.

The present disclosure introduces gate electrodes having the potential of the emitter electrode and restricts the controllable trenches to the designed active channel regions. By utilizing a T-trench shape, the shorting to the emitter is made much easier and better planarization (electric field) is provided between two active cells.

The enhancement layer itself also has the advantage that the on-state losses are reduced. As the electrically conductive layer is "grounded", i.e. electrically connected to the emitter electrode, it does not play a negative role by adding a capacitive effect in the gate circuit and hence, improved switching is obtained with lower losses and good controllability.

The emitter sided structure of the present disclosure can also be applied on other IGBT device types such as reverse conducting designs in a number of possible combinations. The design of the present disclosure is suitable for full or part stripes but can also be implemented in cellular designs.

No complicated steps like trenches having different depths are used for the creation of the IGBT of the present disclosure.

Furthermore, the device of the present disclosure is much easier to manufacture, because its design can be manufactured based on a self-aligned process for the base layer, the enhancement layer and the source regions without having to introduce extra masks.

Additional advantages according to the present disclosure will be apparent from the following description of exemplary embodiments.

Figure 6:
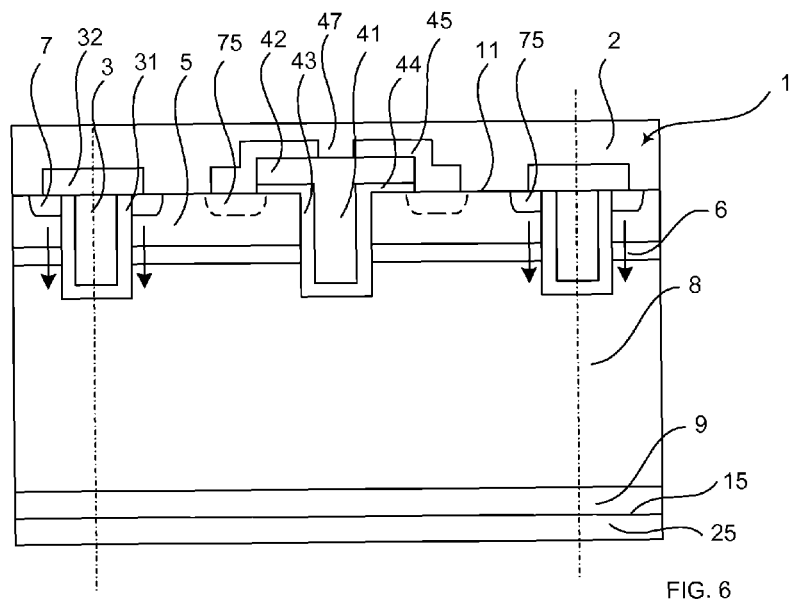
FIG. 6 shows an exemplary embodiment of an IGBT according to the present disclosure.

FIG. 6 shows an exemplary embodiment of a power semiconductor device in the form of an insulated gate bipolar transistor (IGBT) 1 with a four-layer structure (pnpn). The layers are arranged between an emitter electrode 2 on an emitter side 11 and a collector electrode 25 on a collector side 15, which is arranged opposite of the emitter side 11. The IGBT 1 includes the following layers. An (n−) lowly doped drift layer 8 is arranged between the emitter side 11 and the collector side 15.

According to an exemplary embodiment, the drift layer 8 has a constant, uniform low doping concentration. A p doped collector layer 9 is arranged between the drift layer 8 and the collector electrode 25. The collector layer 9 is arranged adjacent to and electrically contacts the collector electrode 25. A p doped base layer is arranged between the drift layer 8 and the emitter electrode 2. The base layer 5 is in direct electrical contact with the emitter electrode 2. The base layer 5 is completely separated from the drift layer 8. That means that at least one other, non-p doped layer is arranged in between. An n doped first source region 7 is arranged on the base layer 5 towards the emitter side 11 and electrically contacts the emitter electrode 2. The first source region 7 has a higher doping concentration than the drift layer 8. With the first source region 7 being arranged on top of the base layer 5, it is meant that the first source region 7 is arranged at the surface at the emitter side 11. The first source region 7 may be embedded in the base layer 5 such that both layers have a common surface on the emitter side 11. At least two first trench gate electrodes 3 are arranged lateral to the base layer 5 and extend deeper into the drift layer 8 from the emitter side 11 than the base layer 5. Each first trench gate electrode 3 is separated from any surrounding layer or region (base layer 5, the enhancement layer 6 and the drift layer 8) by a third insulating layer 43. A first channel is formable from the emitter electrode 2, the first source region 7, the base layer 5 and the drift layer 8 between two first trench gate electrodes 3 (both outer arrows in FIG. 6). The first source region 7 is arranged between two first trench gate electrodes 3. The first trench gate electrodes 3 may have any design well-known to those skilled in the art like cellular design, full or part stripes, for example. A second insulating layer 32 is arranged on the emitter side 11 on top of the first trench gate electrode 3. The second insulating layer 32 insulates the first trench gate electrode 3 from the emitter electrode 2.

An n doped enhancement layer 6, which is higher doped than the drift layer 8, is arranged between the base layer 5 and the drift layer 8. The enhancement layer 6 separates the base layer 5 from the drift layer 8 at least in a plane parallel to the emitter side 11, thereby lowering the enhancement layer losses. A "grounded" gate electrode 4 includes a second trench gate electrode 41 and an electrically conducting layer 42, both of which are grounded, i.e. they are on the potential of the emitter electrode 2. The second trench gate electrode 41 is arranged lateral to the base layer 5 and extends deeper into the drift layer 8 than the base layer 5. The second trench gate electrode 41 is separated from the layers surrounding it, i.e. the base layer 5, the enhancement layer 6 and the drift layer 8, by a third insulating layer 43.

The electrically conductive layer 42 covers and laterally extends outside the second trench gate electrode 41 at least to a region above the base layer 5. The second trench gate electrode 41 is mechanically and electrically connected to the electrically conductive layer 42. The electrically conductive layer 42 contacts the second trench gate electrode 41 and is thereby grounded. The second trench gate electrode 41 and the electrically conductive layer 42 can be made of any suitable electrically conductive material, such as polysilicon or metal, for example. According to an exemplary embodiment, they are made of the same material.

In accordance with an exemplary embodiment, the first trench gate electrode 3 extends from the emitter side 11 to the same depth within the drift layer 8 as the second trench gate electrode 41.

A second channel is formable from the emitter electrode 2, the second source region 75, the base layer 5 and the drift layer 8 between a first trench gate electrode 3 and a second trench gate electrode 4 (shown in FIG. 6 by the two inner arrows). The second source region 7 is arranged between a first trench gate electrode 3 and a second trench gate electrode 4.

Figure 3:
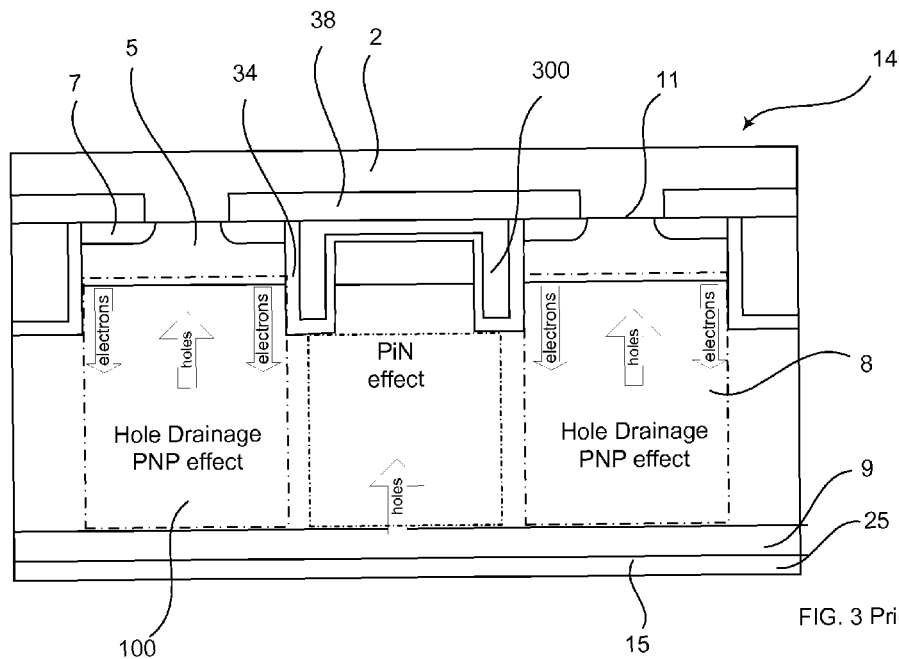
FIG. 3 shows a known IGBT with a pitched trench gate electrode.
Figure 4:
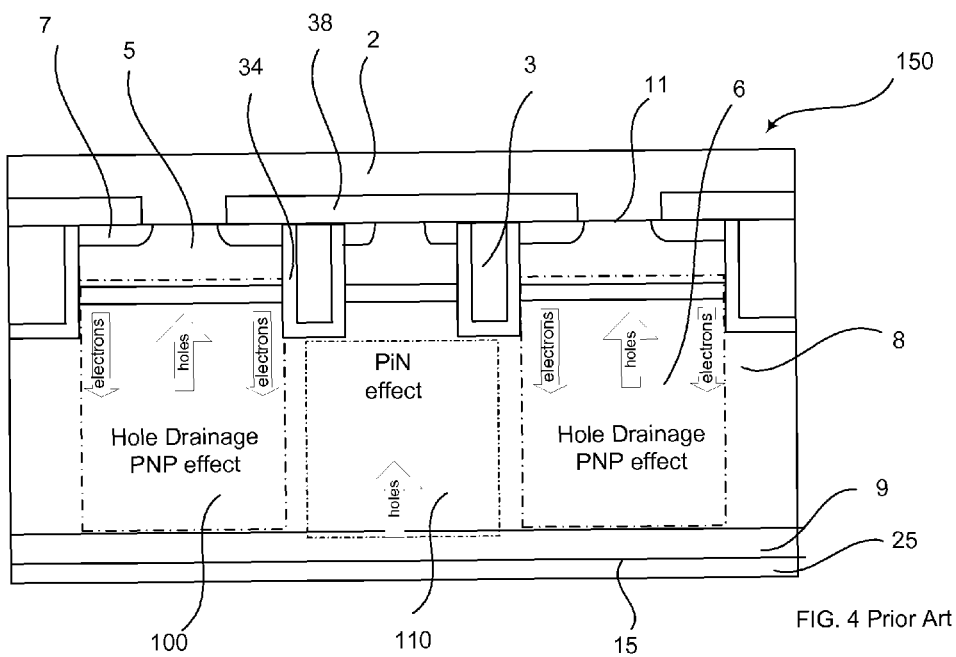
FIG. 4 shows a known IGBT with a dummy cell.
Figure 5:
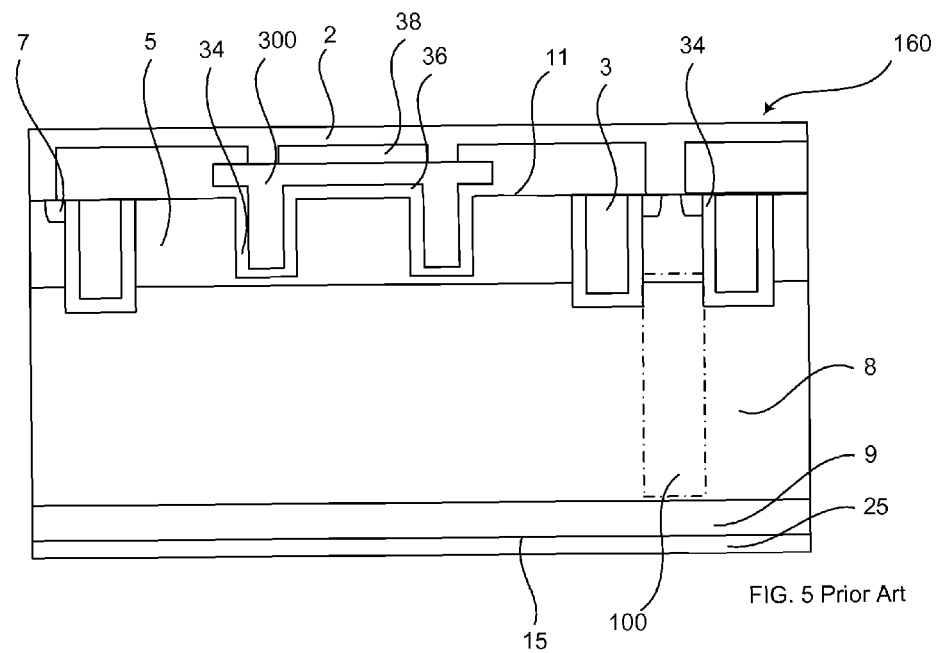
FIG. 5 shows another known IGBT with a pitched trench gate electrode.

The electrically conductive layer 42 is separated from the base layer 5 by a fourth electrically insulating layer 44, which is arranged on top of the emitter side 11 and parallel to the emitter side 11. This fourth insulating layer 44 can be chosen as thin as 50 to 150 nm, for example, which is much thinner than the second insulating layers 32 used in known devices like those shown in FIGS. 3 and 4, which have a second insulating layer 32 in form of a silicon oxide layer with a thickness of 500 to 1500 nm. By having such a thin fourth insulating layer 44, the capacitance is positively reduced, and the switching capability is thereby improved.

A fifth insulating layer 45 is arranged on the emitter side 11 on top of the electrically conductive layer 42. The fifth insulating layer 45 has a recess 47 on that side of the layer 42 which lies opposite to the fourth insulating layer 44, such that the electrically conducting layer 42 electrically contacts the emitter electrode 2.

"Lateral" shall mean in this description that two layers are arranged in a same plane, which plane lies parallel to the emitter side 11. Within that plane, the layers are arranged adjacent to each other or just lateral (neighbored, side to side), whereas the layers may have a distance from each other, i.e. another layer may be arranged between the two layers, but they may also be directly adjacent to each other, i.e. touching each other.

In FIG. 6, a second source region 75 is also shown. The second source region 75 is arranged at the emitter side 11 on the base layer 5 between the first trench gate electrode 3 and the second trench gate electrode 41. The second source regions 75 may, for example, laterally extend from a contact opening of the base layer 5 to the emitter electrode 2 to another optional second source region 75 from the contact opening to a region below the electrically conductive layer 42 of the gate electrode 4. According to an exemplary embodiment, the second source region 75 can be created together with the first source region 7, thus reducing the masking steps during manufacturing. The second source region 75 has a higher doping concentration than the drift layer 8, and may, according to an exemplary embodiment, be the same as the first source region 7. The second source region is shown in FIG. 6 with a dashed line, because if desired the device can be created without such a second source region.

The second source region 75 may also be present or absent in any other power semiconductor device of the present disclosure. This applies especially for any further device shown in the FIGS. 7 to 13. The latch-up effect is reduced if the device does not include such second source regions 75.

The device according to FIG. 6 has two active channels on both sides of a trench gate electrode due to first source region (s) on both sides of the first trench gate electrode 3, first source region(s) 7 on both sides and contact areas on both sides, at which the layers 5, 7 are electrically connected to the emitter electrode 2 (indicated in FIG. 6 by the lines with the arrow at the trench gate electrode 3). One of these channels is arranged between the first trench gate electrode 3 and the second trench gate electrode 41, thus allowing the device to have a compact design while having the advantages of reduced on-state and switching losses, improved blocking capability and good controllability. For such a design, during the manufacturing process, the insulation layer 45 is partly removed between the first and second gate electrode so that third particles for the source regions can be introduced between the first and second trench gate electrode. Of course, for this design, the second insulation layer 45 is only removed such that it still covers and thus separates the first trench gate electrode 3 completely from the emitter electrode 2 and also the electrically conductive layer 42 besides the recess 47 for the contact of the electrically conductive layer 42 to the emitter electrode 2. On the lateral sides (the sides of the electrically conductive layer perpendicular to the emitter side 11), the electrically conductive layer 42 is thus separated from the emitter electrode 2. By such a manufacturing method, the enhancement layer 6 and the base layer 5 and also the source regions are self-aligned, i.e. no special mask has to be applied, but a layer (electrically conductive layer), which is already part of the device, can be used as a mask for the creation of these layers.

Thus, the device has active channels on both sides of the first trench gate electrode 3, i.e. on the side towards another first trench gate electrode 3 and towards the side of a second trench gate electrode 4. On the side towards the second trench gate electrode 4, the base layer 5, as on the other side, contacts the emitter electrode 2, i.e. the fifth insulating layer 45 and the second insulating layer 32 are separated from each other by a contact opening of the base layer 5 for the contact with the emitter electrode 2. Also shown in FIG. 6 is a dotted line, at which the structure shown in FIG. 6 can be continued by mirroring the structure shown between the two dotted lines. Similarly, all structures shown in the drawings can be mirrored. In all other drawings, the structure shown in the drawings can be continued by duplication of the illustrated structures.

In the FIGS. 7 to 13, IGBTs similar to the one shown in FIG. 6 are disclosed, but these IGBTs include additional features as explained in more detail below.

The second source region 75 is exemplarily created together with the first source region 7, thus reducing the masking steps during manufacturing. The second source region 75 has, like the first source regions 7, a higher doping concentration than the lowly doped drift layer 8 (exemplarily having constant doping concentration).

Figure 7:
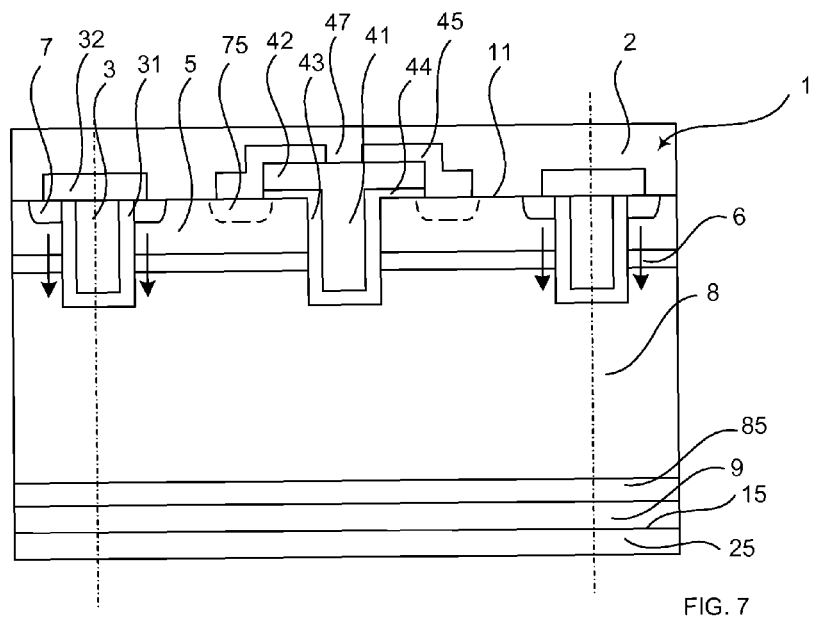
FIGS. 7 to 13 show other exemplary embodiments of IGBTs according to the disclosure.

FIG. 7 shows an exemplary IGBT including an n doped buffer layer 85 having a higher doping concentration than the drift layer 8, which is arranged between the drift layer 8 and the collector layer 9.

Figure 8:
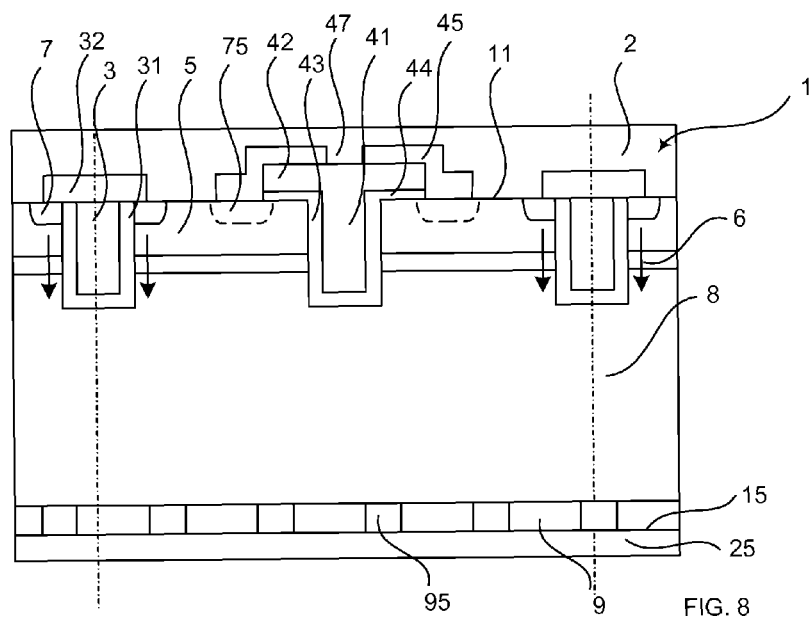

The emitter sided design of the present disclosure can also be applied to a reverse conducting IGBT (FIG. 8), in which an doped first region 95 is arranged in the same plane as the collector layer 9 (i.e. on the collector side 15 and lateral to the collector layer 9), as shown in FIG. 8. The first region 95 is thus arranged alternating to the collector layer 9. The first region 95 has a higher doping concentration than the drift layer 8.

The electrically conductive layer 42 may be made of the same material as the trench gate electrode 41. By its contact with the emitter electrode 2 and the second trench gate electrode 41, the electrically conductive layer 42 and the second trench gate electrode 41 are on the same potential as the emitter electrode 2. Layers 41, 42 are not therefore controllable like the first trench gate electrode 3. Thus, they do not have negative impact on the switching performance due to an increased capacitive effect on the gate.

Figure 9:
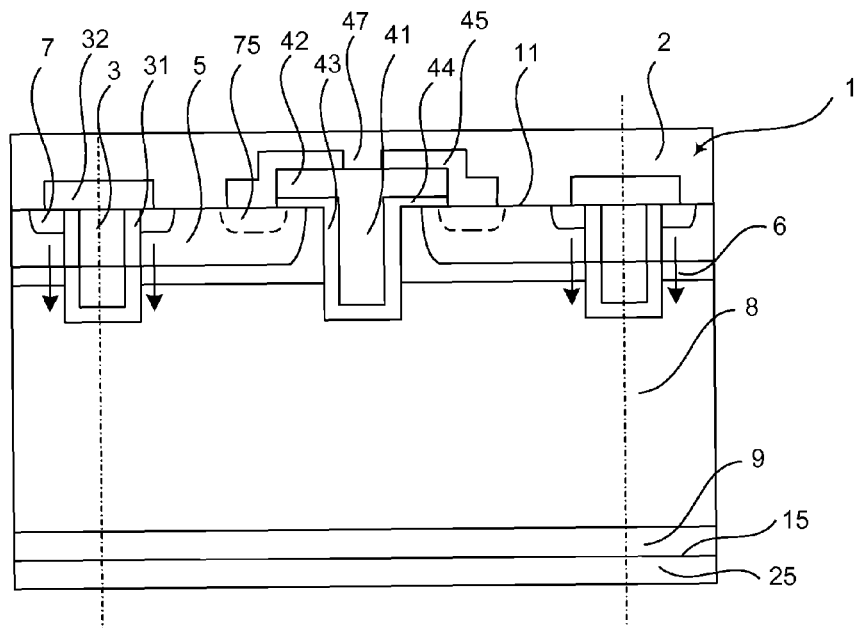

In FIGS. 6 to 8, the base layer 5 and the enhancement layer 6 adjoin the third insulating layer 43 directly, i.e. no other layer is arranged in between. Alternatively, as shown in FIG. 9, the enhancement layer 8 laterally extends to the third electrically insulating layer 43 and it completely surrounds and thereby completely separates the base layer 5 towards the drift layer 8 and the third insulating layer 43. With this arrangement, the enhancement layer 8 surrounds the base layer 5 such that the base layer 5 is separated from the drift layer 8 and the third insulating layer 43, Due to the enhancement layer 6 surrounding the base layer 5 towards the second trench gate electrode 41, the collector-emitter on voltage $V_{ce}$ is further reduced, which advantage is also present in the exemplary embodiment of FIG. 9. The manufacturing of the enhancement layer surrounding the base layer is possible by the electrically conductive layer 42 being used as a mask for the creation of the enhancement layer and the base layer. The electrically conductive layer 42 allows for a self-aligned creation of these layers, i.e. no specials mask has to be applied, which needs to be aligned to the structure of the device.

Figure 10:
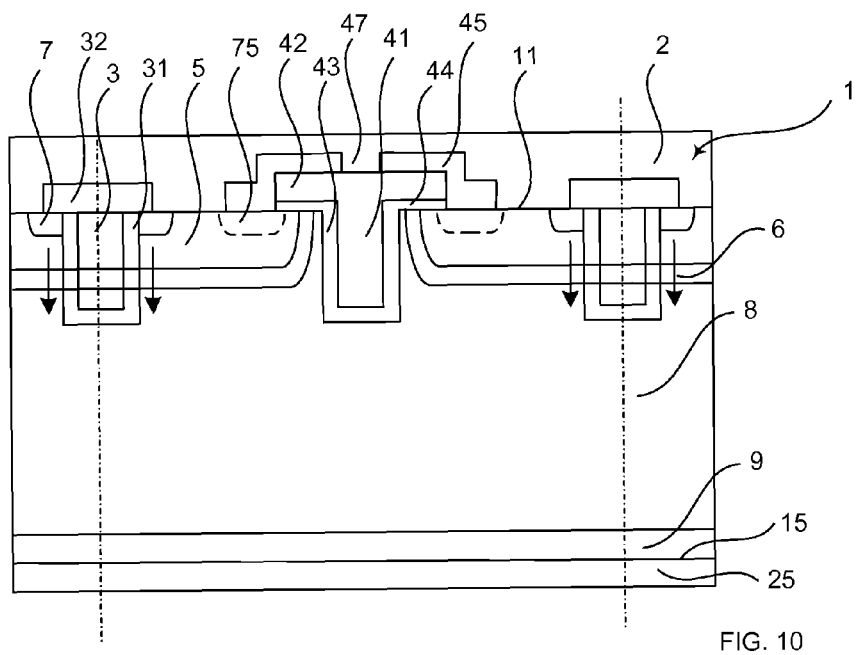

In an exemplary embodiment shown in FIG. 10, the drift layer 8 may extend to the fourth electrically insulating layer 44 in an area between the first and second trench gate electrode 3, 41 such that the enhancement layer 8 is separated from the third insulating layer 43 by the drift layer 8. The enhancement layer 8 completely surrounds the base layer 5 towards the drift layer 8 and the third insulating layer 43. In this embodiment, the drift layer 8 extends to the surface of the wafer, i.e. to the fourth insulating layer 44 so that the enhancement layer 6 and the third insulating layer 43 are separated from each other by the drift layer 8. On state losses may be reduced by such an arrangement.

In an exemplary manufacturing method for this embodiment, the fourth insulating layer 44 and the electrically conductive layer 42 are used as a mask for the creation of the base layer 5 and the enhancement layer 6. In case of a wide electrically conductive layer 44 and a narrow second trench gate electrode 41, the enhancement layer 6 and the second trench gate electrode 41 become disposed from each other.

In accordance with an exemplary embodiment, the IGBT 1 includes a p doped bar having a higher maximum doping concentration than the base layer 5. The bar is arranged at the emitter side 11 in a plane perpendicular to the perspective shown in the FIGS. 6 to 13. At the bar, the source regions 7, 75, the base layer 5, and the first and second trench gate electrodes 3, 41 terminate. The bar extends to the surface of the wafer. The bar extends in a plane parallel to the emitter side perpendicular to the direction in which the first source regions 7 attach to the first trench gate electrodes 3 or in which the enhancement layer 6 separated the base layer 5 from the second trench gate electrode 41. The bar extends to the surface of the wafer. The bar extends in a plane parallel to the emitter side perpendicular to the direction in which the first source regions 7 attach the first trench gate electrodes 3.

The distance between two ground trench gate electrodes 41, 410 or between a second trench gate electrode 41, 410 to an active one 3, should be equal or smaller than the trench thickness (measured from the emitter side 11 and in a direction perpendicular to the emitter side 11). Such a small distance between the trenches 3, 41, 410 ensures good blocking properties. If the distance gets too large, the blocking will drop.

The electrically conductive layer 42 may extend outside the second trench gate electrode 41 by a value corresponding approximately to the thickness of the second trench gate electrode (in a direction perpendicular to the emitter side 11), for example, the layer 42 extends by half the thickness of the trench gate electrode. The thickness of the second trench gate electrode 41 shall be measured from the emitter side 11. This means that in an exemplary embodiment, the electrically conductive layer 42 laterally extends outside the second trench gate electrode 41 by 2 to 10 µm on each side, for example, by 2 to 5 µm and in another exemplary embodiment by 5 to 10 µm on each side.

In accordance with an exemplary embodiment, the IGBT of the present disclosure includes a further second trench gate electrode 40, which is arranged adjacent to the primary second trench gate electrode 4.

The further second gate electrode 40 includes a further second trench gate electrode 410 and a further electrically conducting layer 420, both of which are grounded as described above for the gate electrode 4. The further second trench gate electrode 410 is arranged lateral to the base layer 5 and extends deeper into the drift layer 8 than the base layer 5. The further second trench gate electrode 410 is separated from the base layer 5, the enhancement layer 6 and the drift layer 8 by a further third insulating layer 430.

The further electrically conductive layer 420 covers and laterally extends outside the further second trench gate electrode 410 at least to a region above the base layer 5. The further second trench gate electrode 410 is mechanically and electrically connected to the further electrically conductive layer 420. The further electrically conductive layer 420 contacts the further second trench gate electrode 410 and is thereby grounded, i.e. it is on the potential of the emitter electrode. The further second trench gate electrode 410 and the further electrically conductive layer 420 can be made of any suitable electrically conductive material, for example, polysilicon or metal. According to an exemplary embodiment, they are made of the same material and they are made in the same manufacturing step as the gate electrode 4. In an exemplary embodiment, the first trench gate electrode 3 and the second trench gate electrode 41 extend from the emitter side 11 to the same depth within the drift layer 8 as the further second trench gate electrode 410.

Figure 11:
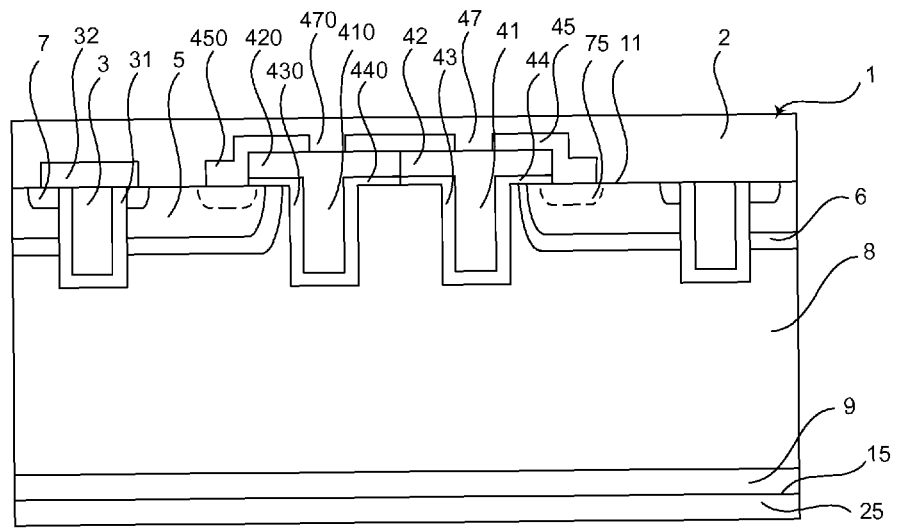
Figure 12:
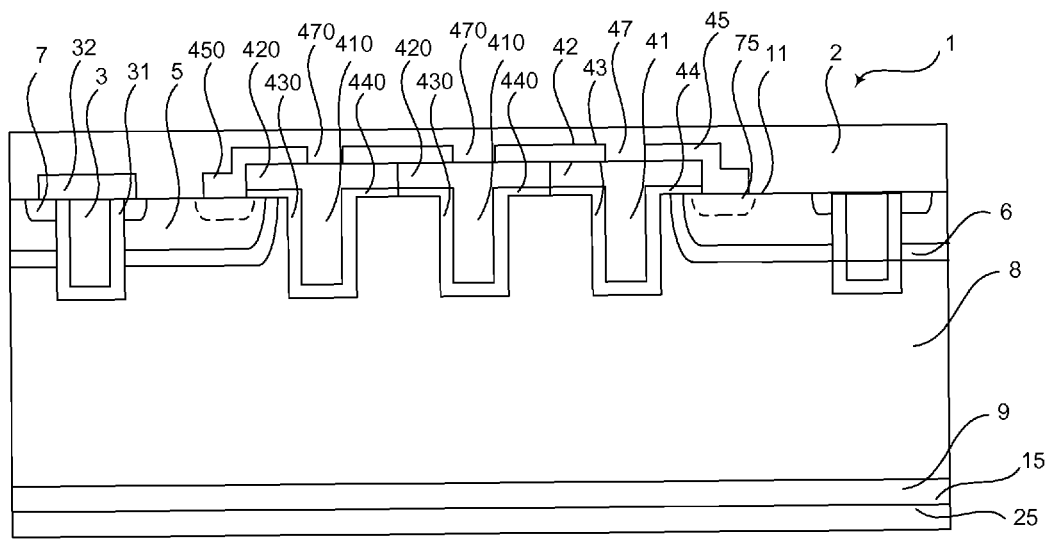

In FIGS. 11 and 12, an IGBT having such a further gate electrode 40 is shown. The further electrically conductive layer 420 and the further second trench gate electrode 410 touch each other, i.e. they are arranged directly adjacent to each other so that no other layer is arranged in between. Only the drift layer 8 is arranged in the area between the second trench gate electrode 41 and the further second trench gate electrode 410. There is no other n or p doped layer arranged in this area.

Figure 13:
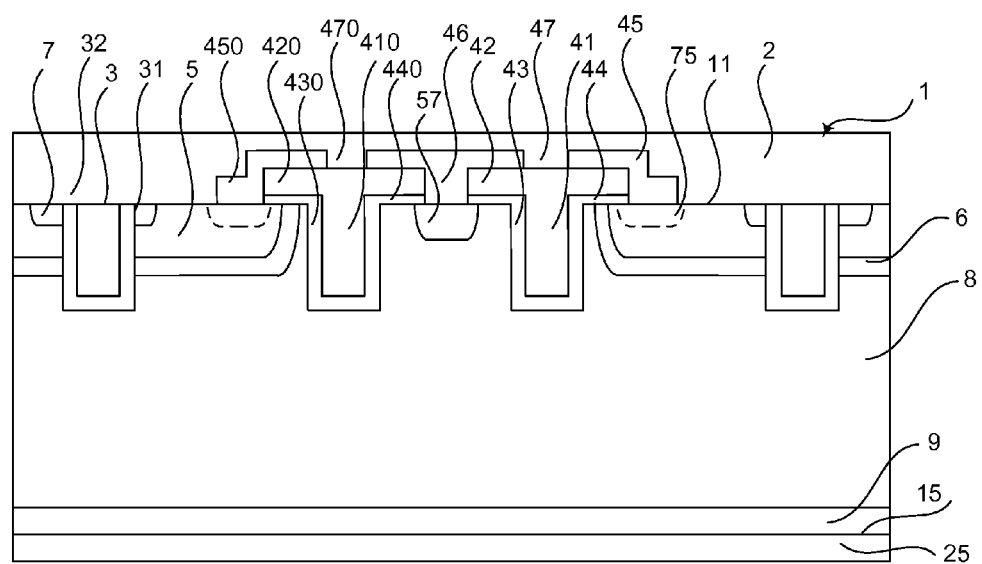

In accordance with an exemplary embodiment shown in FIG. 13, an IGBT of the present disclosure also includes a further gate electrode 410. It is arranged adjacent to the gate electrode 4. However, the further electrically conductive layer 420 and the further second trench gate electrode 410 are separated from each other by a sixth insulating layer 46. The drift layer 8 laterally extends to the fourth insulating layer 44 and the further fourth insulating layer 440 in the area between the second trench gate electrode 4 and the further second trench gate electrode 40. A connection layer 57 is arranged below the sixth insulating layer 46, which laterally extends to a region below the electrically conductive layer 42 and the further electrically conductive layer 420. The connection layer 57 may be either of n doping type (with a higher doping concentration than the drift layer 8) or of p type (having either the same doping concentration as the base layer or a different doping concentration).

Due to the connection layer 57, blocking is improved and losses are reduced. The distance between cells (active and grounded), i.e. between two trenches, is in the order of the trench thickness, for example, at most equal to the trench gate electrode thickness or even smaller. This means that any two trenches are disposed by at most the thickness of the trenches gate electrodes 3, 41, 410 (which thickness is measured in a direction perpendicular to the emitter side 11).

The further second trench gate electrode 140 is utilized for improved blocking and lower capacitance and can be introduced as a connected chain of gate electrodes 4, 40 to enlarge the cell pitch. The devices of the present disclosure may include a plurality of such further second trench gate electrodes arranged in the same manner as disclosed above (exemplarily shown in FIG. 12 for an IGBT including a gate electrode 4 connected in this embodiment to two further gate electrodes by having the electrically conductive layers connected). Also, the exemplary device of the present disclosure as shown in FIG. 13 can be extended with further gate electrodes, i.e. with electrically conductive layers 42, 420 spaced apart from each other by the presence of a sixth insulating layer 46 in between and a connection layer 57 there under.

In accordance with an exemplary embodiment, the conductivity types of the aforementioned exemplary devices are switched, i.e. all layers of the first conductivity type are p type (e.g. the drift layer 8, the first and second source region 7, 75), and all layers of the second conductivity type are n type (e.g. base layer 5, collector layer 9).

The IGBT 1 of the present disclosure is manufactured by the following method. A lowly (n−) doped wafer having an emitter side 11 (on which in the finalized device an emitter electrode 2 is arranged) and a collector side 15 (on which in the finalized device a collector electrode 25 is arranged) is provided. The wafer has a uniform, constant doping concentration. The wafer may be made on a basis of a silicon or GaN or SiC wafer, for example. Part of the wafer having unamended low doping in the finalized insulated gated bipolar transistor 1 forms a drift layer 8.

Trench recesses are introduced in the wafer on the emitter side 11, in which first and third insulating layers 31, 43 are applied so that the trench recesses are coated with the first and third insulating layers 31, 43. The coated trench recesses are then filled with an electrically conductive material such as a heavily doped polysilicon or a metal like aluminum, for example. By this step, first and second trench gate electrodes 3, 41 are created.

A fourth insulating layer 44 is created, which laterally surrounds the second trench gate electrode 41 on the emitter side 11.

An electrically conductive layer 42 is created on top of the second trench gate electrode 41, which electrically conductive layer 42 covers and laterally extends outside the second trench gate electrode 41. A gate electrode includes the second trench gate electrode 41 and the electrically conductive layer 42.

This electrically conductive layer 42 may be formed of the same material as the second trench gate electrode 41, but other electrically conductive materials can also be used. The electrically conductive layer 42 covers the second trench gate electrode 41 and extends laterally (i.e. in a plane parallel to the emitter side 11) beyond the second trench gate electrode 41 so that the second trench gate electrode 41 is covered by the electrically conductive layer 42. The electrically conductive layer 42 may exemplarily extend outside the well 5 by 2 to 10 μm, in another exemplary embodiment by 2 to 5 μm or by 5 to 10 μm. As the fourth insulating layer 44 insulates the electrically conductive layer 42 from the layers, which are arranged on the lateral sides of the second trench gate electrode 41 and which extend to the surface of the wafer, it extends laterally at least to the lateral sides of the electrically conductive layer 42 or even beyond its lateral sides.

Then, an enhancement layer 6 is formed by introducing an n first dopant on the emitter side 11, which is diffused into the wafer using the electrically conductive layer 42 as a mask.

After the introduction of the n first dopant, a base layer 5 is formed by introducing a p second dopant on the emitter side 11, using the electrically conductive layer 42 as a mask. The p second dopant is diffused into the wafer from the emitter side 11 to a lower depth than the depth into which the first dopant has been diffused so that the base layer 5 is embedded in the enhancement layer 6. Depending on the distance to which the electrically conductive layer 42 extends beyond the second trench gate electrode 41 and depending on the diffusion depth/length of the first and second dopants, the embodiments shown in the FIG. 10 (enhancement layer 6 extending to the second trench gate electrode 41, but separating the second trench gate electrode 41 from the base layer 5) or in FIG. 12, in which the enhancement layer 6 still separates the base layer 5 from the drift layer 8, but is separated from the second trench gate electrode 41 by the drift layer 8, are achieved. In such a device, the first dopant is not laterally diffused so far as to reach the second trench gate electrode 41.

Then, an n third dopant is introduced for forming first and second source regions 7, 75, which have higher doping concentration than the lowly doped wafer/drift layer 8. The first source region 7 is created between two first trench gate electrodes 3, and the second source region 75 is created between a first trench gate electrode 3 and a second trench gate electrode 4. According to an exemplary embodiment, the third dopant is activated afterwards.

The electrically conductive layer 42 is used in this case as a mask for introducing the n third dopant. First source regions between two first trench gate electrodes 3 and second source regions 75 between a first trench gate electrode 3 and a second trench gate electrode 41 are created. The fifth insulating layer 45 may then be applied after the creation of the source regions 7, 75. The fifth insulating layer 45 covers the second source region 75, the electrically conductive layer 42 besides the recess 47 and leaves open a contact opening between two first trench gate electrodes 3. The first trench gate electrode 3 is also covered with the fifth insulation layer 45 in order to insulate the first trench gate electrode 3 from the emitter electrode 2. An etch step is exemplarily performed in order to etch through a first source region 7 for the contact of the base layer 5 to the emitter electrode 2 (not shown in the drawings; by this method, the contact opening of the base layer 5 to the emitter electrode 2 is arranged in a plane below the emitter side 11). The emitter side 11 of the wafer shall be the most outer plane, in which layers or regions are arranged in the wafer parallel at the side, at which the emitter electrode 2 is arranged. Alternatively, source regions are created with a mask, which covers a central area between two first trench gate electrodes 3 for the contact of the base layer 5 to the emitter electrode 3.

Alternatively, a fifth insulating layer 45 is applied on top of the electrically conductive layer 42, which laterally extends to the first trench gate electrode 3. The fifth insulating layer 45 is made with a recess 47 on the electrically conductive layer 42 for a contact of the electrically conductive layer 42 to the emitter electrode 2 and with a contact opening of the emitter electrode 2 to the base layer 5. The recess 47 and contact opening are exemplarily made by partial removal of the fifth insulating layer 45 on top of the base layer 6 and electrically conductive layer 42, respectively. In the contact opening an n third dopant is introduced using the fifth insulating layer 45 and the electrically conductive layer 42 as a mask for forming first source regions 7. Examplarily the third dopant is activated afterwards.

Examplarily, a p collector layer 9 is then formed by introducing a p fourth dopant on the collector side 15, which is diffused into the wafer. The collector layer 9 may also be made at another manufacturing step.

If a buffer layer 85 is created (see FIG. 8), the buffer layer 85 is created before the collector layer 9. The buffer layer 85 is exemplarily created by introducing an n dopant on the collector side 15. The buffer layer 85 always has higher doping concentration than the drift layer 8.

Contact openings of the base layer 5 to the emitter electrode 3 between two first trench gate electrodes 3 and between a first trench gate electrode 3 and a second trench gate electrode 4 are then created ("created" in this step shall also cover the case in which the contact openings have already been provided by having created source regions 7, 75 with a contact opening of the base layer to the emitter electrode, i.e. by having created the source regions with a mask, which covers a central part between two first trench gate electrodes 3 or between a first and second trench gate electrode 3, 4). According to an exemplary embodiment, an etch step is exemplarily performed in order to etch through the fifth insulating layer 45 and the first source region 7 and second source region 75 for contact openings of the base layer 5 to the emitter electrode 2 (not shown in the drawings; by this method, the contact opening of the base layer 5 to the emitter electrode 2 is arranged in a plane below the emitter side 11. The emitter side 11 of the wafer shall be the most outer plane, in which layers or regions are arranged in the wafer parallel at the side, at which the emitter electrode 2 is arranged.

Finally, an emitter electrode 2 and a collector electrode 25 are made, either simultaneously or one after the other.

The dopants can be introduced by any appropriate method like implantation or deposition. Diffusion steps can be made directly after the introducing of the corresponding dopant, but can also be performed at a later stage, for example, for the base layer 5. The doping profile of a diffused layer decreases from a maximum value steadily to zero at the maximum diffusion depth of the dopant (which depends on the dopant sort and the diffusion conditions like diffusion time and temperature).

It should be noted that the term "including" or "comprising" does not exclude other elements or steps, and that the indefinite article "a" or "an" does not exclude the plural. Also, elements described in association with different embodiments may be combined.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 IGBT
11 Emitter side
15 Collector side
100 active cell
110 dummy cell
120, 130, 140, 150, 160 known IGBT
2 Emitter electrode
25 Collector electrode
3 First trench gate electrode
31 Planar gate
300 Pitched trench gate
31 First insulating layer
32 Second insulating layer
4 gate electrode
41 Second trench gate electrode
42 Electrically conductive layer
43 Third insulating layer
44 Fourth insulating layer
45 Fifth insulating layer
46 Sixth insulating layer
47 Recess
40 Further gate electrode
410 Further second trench gate electrode 420 Further electrically conductive layer
430 Further third insulating layer
440 Further fourth insulating layer
450 Further fifth insulating layer
470 Further recess
5 Base layer
57 Connection layer
6 Enhancement layer
7 First source region
75 Second source region
8 Drift layer
85 Buffer layer
9 Collector layer
95 First region

What is claimed is:

1. An insulated gated bipolar transistor having layers between an emitter electrode on an emitter side and a collector electrode on a collector side opposite to the emitter side, the insulated gated bipolar transistor comprising:
a lowly doped drift layer of a first conductivity type;
a collector layer of a second conductivity type different than the first conductivity type, the collector layer being arranged between the drift layer and the collector electrode and electrically contacting the collector electrode;
a base layer of the second conductivity type arranged between the drift layer and the emitter electrode, the base layer electrically contacting the emitter electrode and being completely separated from the drift layer,
first and second source regions of the first conductivity type arranged on the base layer towards the emitter side and electrically contacting the emitter electrode, the first and second source regions having a higher doping concentration than the drift layer;
at least two first trench gate electrodes arranged lateral to the base layer and extending deeper into the drift layer than the base layer, the at least two first trench gate electrodes being separated from the base layer, the first source region and the drift layer by a first insulating layer, wherein a first channel is formable from the emitter electrode, the first source region, the base layer and the drift layer between two of the first trench gate electrodes, the first source region being arranged between two of the first trench gate electrodes;
a second insulating layer arranged on the emitter side on top of the first trench gate electrodes;
an enhancement layer of the first conductivity type arranged between the base layer and the drift layer, the enhancement layer separating the base layer from the drift layer at least in a plane parallel to the emitter side and having a higher doping concentration than the drift layer;
a gate electrode including a second trench gate electrode and an electrically conducting layer, both of which are electrically connected to the emitter electrode, the second trench gate electrode being arranged lateral to the base layer and extending deeper into the drift layer than the base layer, the second trench gate electrode being separated from the base layer, the enhancement layer and the drift layer by a third insulating layer, wherein a second channel is formable from the emitter electrode, the second source region, the base layer and the drift layer between one of the first trench gate electrodes and the second trench gate electrode, the second source region being arranged between one of the first trench gate electrodes and the second trench gate electrode,
wherein the electrically conductive layer covers and laterally extends outside the second trench gate electrode at least to a region above the base layer,
wherein the electrically conductive layer is separated from the base layer by a fourth electrically insulating layer,
wherein the electrically conductive layer contacts the second trench gate electrode, and
wherein the insulated gated bipolar transistor comprises a fifth insulating layer arranged on the emitter side on top of the electrically conductive layer, the fifth insulating layer having a recess such that the electrically conducting layer electrically contacts the emitter electrode.

2. The insulated gated bipolar transistor according to claim 1, wherein at least one of the first trench gate electrodes extends to the same depth within the drift layer as the second trench gate electrode.

3. The insulated gated bipolar transistor according to claim 1, comprising:
a first region of the first conductivity type arranged on the collector side laterally to the collector layer, the first region having a higher doping concentration than the drift layer.

4. The insulated gated bipolar transistor according to claim 1, wherein the electrically conductive layer is made of the same material as the second trench gate electrode.

5. The insulated gated bipolar transistor according to claim 1, comprising:
a bar of the second conductivity type having a higher doping concentration than the base layer, the bar being arranged at the emitter side in a plane parallel to the emitter side and perpendicular to a direction in which the first source regions attach to the first trench gate electrode and at which the bar the first source region, the base layer, the first gate electrodes and the second trench gate electrode terminate.

6. The insulated gated bipolar transistor according to claim 1, wherein the base layer extends laterally to the third insulating layer.

7. The insulated gated bipolar transistor according to claim 1, wherein the enhancement layer surrounds the base layer such that the base layer is separated from the drift layer and the third insulating layer.

8. The insulated gated bipolar transistor according to claim 1, wherein the drift layer extends laterally to the fourth electrically insulating layer in an area between the first and second trench gate electrode so that the enhancement layer is separated from the third insulating layer by the drift layer.

9. The insulated gated bipolar transistor according to claim 1, wherein the fourth electrically insulating layer has a thickness between 50 to 150 nm.

10. The insulated gated bipolar transistor according to claim 1, wherein the electrically conductive layer extends outside the second trench gate electrode by 2 to 10 μm on each side.

11. The insulated gated bipolar transistor according to claim 1, comprising:
a further gate electrode including a further second trench gate electrode and a further electrically conducting layer, both of which are electrically connected to the emitter electrode, the further second trench gate electrode being arranged lateral to the base layer and extending deeper into the drift layer than the base layer, and the further second trench gate electrode being separated from the base layer, the enhancement layer and the drift layer by a further third insulating layer, wherein the further electrically conductive layer covers and laterally extends outside the further second trench gate electrode at least to a region above the base layer, wherein the further electrically conductive layer is separated from the base layer by a further fourth electrically insulating layer, wherein the further electrically conductive layer contacts the further second trench gate electrode, wherein the further gate electrode is arranged adjacent to the second gate electrode, wherein the further electrically conductive layer and the further grounded trench gate electrode are arranged directly adjacent to each other, and wherein only the drift layer is arranged in the area between the second trench gate electrode and the further second trench gate electrode.

12. The insulated gated bipolar transistor according to claim 11, comprising:
at least two further grounded trench gate electrodes.

13. The insulated gated bipolar transistor according to claim 11, wherein a distance between any two trench gate electrodes is equal to or smaller than a thickness of at least one of the trench gate electrodes.

14. The insulated gated bipolar transistor according to claim 1, comprising:
a further gate electrode arranged adjacent to the gate electrode, the further gate electrode including a further second trench gate electrode and a further electrically conducting layer, both of which are electrically connected to the emitter electrode, the further second trench gate electrode being arranged lateral to the base layer and extending deeper into the drift layer than the base layer, the further second trench gate electrode being separated from the base layer, the enhancement layer and the drift layer by a further third insulating layer, wherein the further electrically conductive layer covers and laterally extends outside the further second trench gate electrode at least to a region above the base layer, wherein the further electrically conductive layer is separated from the base layer by a further fourth electrically insulating layer, wherein the further electrically conductive layer contacts the further second trench gate electrode, wherein the electrically conductive layer and the further electrically conductive layer are separated from each other by a sixth insulating layer, wherein the drift layer extends to the fourth insulating layer and the further fourth insulating layer, and wherein a connection layer is arranged below the sixth insulating layer, the connection layer extending to a region below the electrically conductive layer and the further electrically conductive layer.

15. The insulated gated bipolar transistor according to claim 14, comprising:
at least two further grounded trench gate electrodes.

16. The insulated gated bipolar transistor according to claim 15, wherein a distance between any two trench gate electrodes is equal to or smaller than a thickness of at least one of the trench gate electrodes.

17. The insulated gated bipolar transistor according to claim 1, wherein a distance between any two trench gate electrodes is equal to or smaller than a thickness of at least one of the trench gate electrodes.

18. A method of manufacturing an insulated gated bipolar transistor having layers between an emitter electrode on an emitter side and a collector electrode on a collector side opposite to the emitter side, the method comprising:

providing a lowly doped wafer of a first conductivity type, part of the wafer having an unamended doping concentration in the finalized insulated gated bipolar transistor forming a drift layer;

creating at least two first trench gate electrodes and at least one second trench gate electrode;

creating, for the first and second trench gate electrodes, first and second trench gate electrode trench recesses in the wafer on the emitter side;

applying first and third insulating layers in the trench recesses and filling the trench recesses with electrically conductive material;

creating a fourth insulating layer to laterally surround the second trench gate electrode on the emitter side;

creating an electrically conductive layer on top of the second trench gate electrode, the electrically conductive layer covering and laterally extending outside the second trench gate electrode, wherein a gate electrode comprises the second trench gate electrode and the electrically conductive layer;

creating an enhancement layer by introducing a first dopant of the first conductivity type into the wafer on the emitter side using the electrically conductive layer as a mask and diffusing the first dopant into the wafer;

creating a base layer by introducing a second dopant of a second conductivity type, which is different than the first conductivity type, into the wafer on the emitter side using the electrically conductive layer as a mask and diffusing the second dopant into the wafer so that the base layer is completely separated from a remaining lowly doped wafer by the enhancement layer;

creating first and second source regions having a higher doping concentration than the lowly doped wafer by applying a third dopant of the first conductivity type between two of the first trench gate electrodes for the creation of the first source region and between one of the first trench gate electrodes and the second trench gate electrode for the creation of the second source region;

covering the electrically conductive layer with a fifth insulation layer besides a recess for a contact of the electrically conductive layer to the emitter electrode and covering the first trench gate electrode with the second insulation layer;

creating a collector layer of the second conductivity type on the collector side by introducing a fourth dopant of the second conductivity type into the wafer on the collector side and diffusing the fourth dopant into the wafer, creating contact openings of the base layer to the emitter electrode between two of the first trench gate electrodes and between one of the first trench gate electrodes and the second trench gate electrode; and creating the emitter electrode on the emitter side and creating the collector electrode on the collector side.

* * * * *